United States Patent [19]
Kojima

[11] Patent Number: 5,965,921
[45] Date of Patent: Oct. 12, 1999

[54] HIGH VOLTAGE INVERTER CIRCUIT

[75] Inventor: Yoshikazu Kojima, Chiba, Japan

[73] Assignee: Seiko Instruments Inc., Chiba, Japan

[21] Appl. No.: 08/680,346

[22] Filed: Jul. 17, 1996

[30] Foreign Application Priority Data

| Jul. 24, 1995 | [JP] | Japan | 7-187543 |
| Sep. 1, 1995 | [JP] | Japan | 7-225075 |
| Sep. 19, 1995 | [JP] | Japan | 7-239787 |
| Sep. 19, 1995 | [JP] | Japan | 7-239788 |
| Oct. 20, 1995 | [JP] | Japan | 7-273129 |
| Oct. 20, 1995 | [JP] | Japan | 7-273130 |
| Jul. 5, 1996 | [JP] | Japan | 8-176894 |

[51] Int. Cl.[6] ............ H01L 29/76; H01L 27/01; H01L 29/00; H01L 29/94
[52] U.S. Cl. ............ 257/369; 257/341; 257/350; 257/500
[58] Field of Search ............ 257/256, 260, 257/261, 262, 402, 341, 401, 408

[56] References Cited

U.S. PATENT DOCUMENTS

| 4,488,351 | 12/1984 | Momose | 257/408 |
| 4,509,070 | 4/1985 | Furumura | 257/262 |
| 5,635,749 | 6/1997 | Hong | 257/402 |

*Primary Examiner*—Wael M. Fahmy
*Attorney, Agent, or Firm*—Loeb & Loeb LLP

[57] ABSTRACT

In an integrated circuit type semiconductor device consisting of MISFETs, high rated voltage characteristic is obtained in a gate insulation film structure of a thin film. Further, a reduction in the manufacturing cost of semiconductor devices including high-rated voltage and low rated voltage MISFETs. An intermediate gate electrode is provided which overlies a channel formation region and a gate region with the same gate insulation film being sandwiched therebetween. The gate region is provided on the surface of a substrate. The channel formation region has an impedance indirectly controllable via the intermediate gate electrode upon application of a voltage to the gate region. The intermediate gate electrode is provided with a voltage reset (set) means connected thereto for eliminating the occurrence of charge-up.

17 Claims, 13 Drawing Sheets

F I G. 4
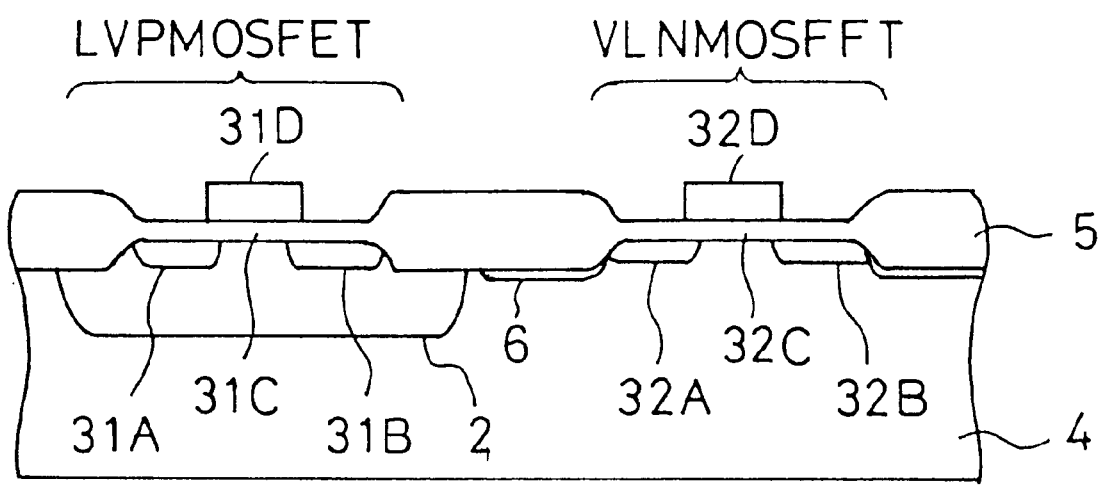

F I G. 1 4
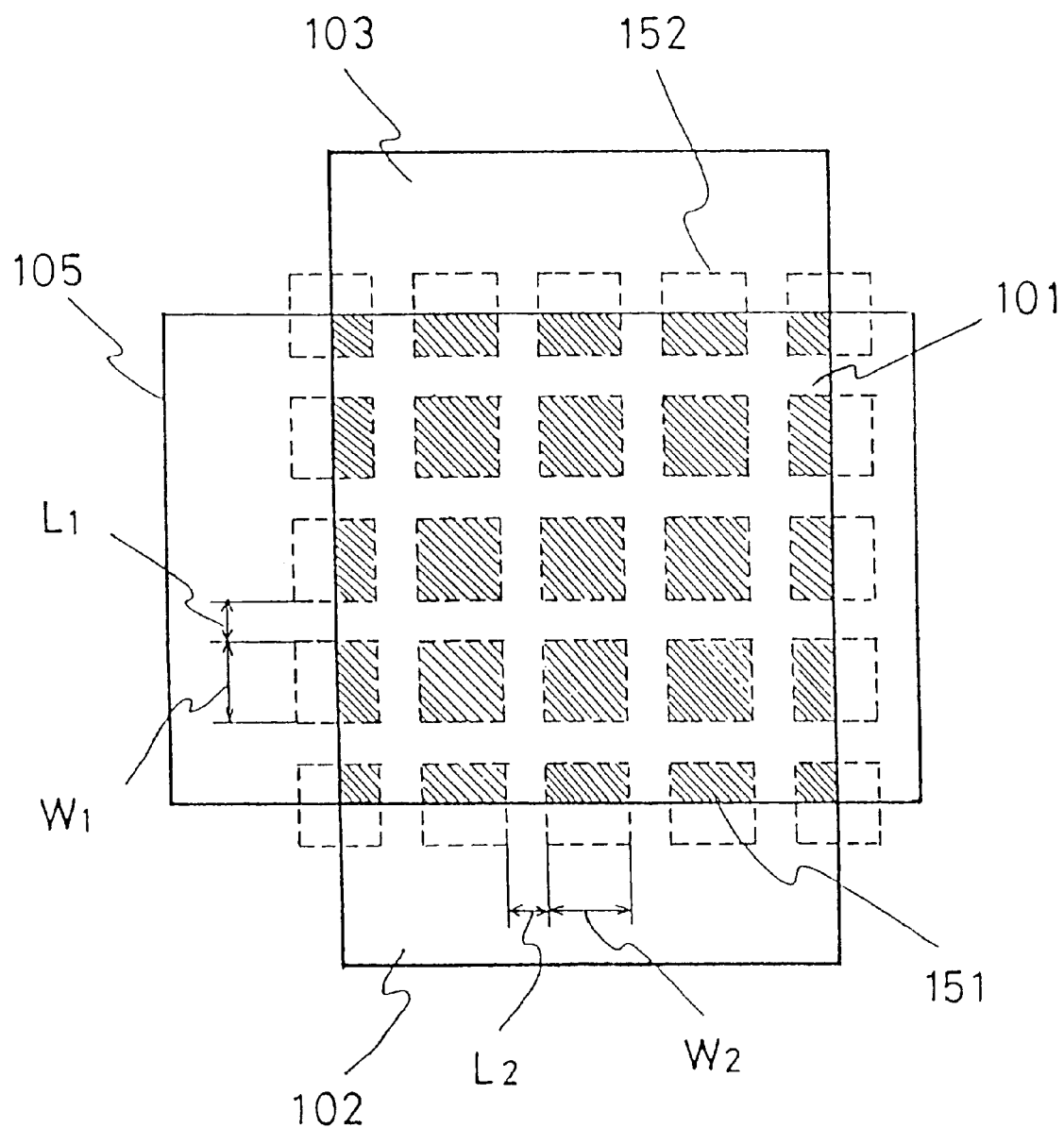

HIGH VOLTAGE INVERTER CIRCUIT

BACKGROUND OF THE INVENTION

This invention relates to CMOS semiconductor devices operating with a low voltage power supply and a high rated voltage. This invention relates to semiconductor integrated circuits for formation of a CPU or the like, and in more particular to semiconductor devices for use in logic circuits or drive circuits suitable for high voltage drive.

A cross-section of one prior art high rated voltage inverter circuit with CMOS structure is shown in FIG. 2. An N well 2 is provided in the surface of a P type silicon substrate 1. Provided in the surface of the N well is a high rated voltage P type insulated gate field effect transistor (referred to as "HVPMOSFET" hereinafter). A high rated voltage insulated gate field effect transistor (HVNMOSFET) is provided in the surface of the P type substrate 1. The HVPMOSFET has a drain region which consists of a lightly doped drain region 21C and a heavily doped drain region 21D within it in order to attain an increased withstanding voltage. A source region also consists of a lightly doped source region 21 and a heavily doped source region 21A as needed. Likewise, a source region of the HVNMOSFET consists of a lightly doped source region 22B and a heavily doped source region 22A, while a drain thereof consists of a lightly doped drain region drain 22C and a heavily doped drain region 22D. Gate electrodes 21F, 22F overlie the substrate with gate insulation films 21E, 22E being provided therebetween respectively. While not shown in the drawing, a low rated voltage P type insulated gate field effect transistor (LVPMOSFET) and a low rated voltage N type insulated gate field effect transistor (LVNMOSFET) are formed in the surface of the same substrate. Since there is no need for drain regions of the LVNMOSFET and LVPMOSFET to exhibit high rated voltage, these are formed of heavily doped drain regions only.

FIG. 3 is a cross-sectional view of a typical prior art insulated gate field effect transistor (referred to as "MISFET" hereinafter). In the case of an N type MISFET as an example, an N type source region 102 and a drain region 103 spaced apart from each other are provided in the surface of a P type silicon substrate 101, while a gate electrode 122 is provided to overlie a channel formation region consisting of a substrate portion defined between the source region 102 and drain region 103 with a gate oxide film 121 being sandwiched therebetween. Upon application of a positive voltage at the gate electrode 122 relative to the source region 102, the channel formation region is inverted in conductivity from P type to N type causing a drain current to flow between the source region 102 and the drain region 103. This enables the gate electrode 122 to control the impedance between the source region 102 and the drain region 103. When a high voltage higher than the power supply voltage is applied to the gate electrode 122, the high voltage is also applied to the gate oxide film 121. Accordingly, as shown in FIG. 3, in a MISFET being applied with such high voltage, a gate insulation film is provided which is greater in thickness than a MISFET operating with a low potential gate voltage.

However, in the prior art semiconductor device, since almost entire voltage applied as the gate voltage is applied to the gate insulation film, there are problems that follow.

(1) It is difficult to make thinner the gate insulation film with respect to the gate voltage.

(2) When the high rated voltage MISFET and low rated voltage MISFET are formed together on the same substrate, it is required that an individual gate insulation film be provided for each MISFET.

Further, in the prior art semiconductor device, there is a problem in that the manufacturing cost thereof remains higher due to additional formation of lightly doped drain regions of HVPMOSFET and HVNMOSFET.

It is therefore an object of the present invention to obtain a semiconductor device of simple structure and low cost which does not require any new, additional manufacturing steps of forming lightly doped drain regions, enables gate insulation films to be made thinner, and also avoids the use of a plurality of gate insulation films.

SUMMARY OF THE INVENTION

In order to solve the aforesaid problems, this invention employs the following means:

(1) A semiconductor device is arranged in such a manner that it comprises a low-voltage inverter circuit having a low rated voltage first conductivity type insulated gate field effect transistor (MISFET) and a low rated voltage second conductivity type MISFET being connected in series between first power supply voltages, a level-shift circuit connected to an output of the low-voltage inverter circuit for operating with a second power supply voltage higher than the first power supply voltages, a high-voltage inverter circuit having a high rated voltage first conductivity type MISFET and a high rated voltage second conductivity type MISFET being connected in series to the second power supply voltage, and an output terminal corresponding to an output of the high-voltage inverter circuit, featured in that the impurity concentration of a drain region of the high rated voltage first conductivity type MISFET is the same as that of an isolation region between the high rated voltage second conductivity type MISFETs, that the low rated voltage first conductivity type MISFET is formed in a surface of a second conductivity type diffusion layer as provided in a surface of a semiconductor substrate of the first conductivity type, and that the drain region of the high rated voltage second conductivity type MISFET is the same in impurity concentration as the second conductivity type diffusion layer.

(2) There is employed a manufacturing method of a semiconductor device having a semiconductor substrate with its surface having a plurality of first conductivity type low rated voltage MISFETs, a plurality of second conductivity type low rated voltage MISFETs, a first conductivity type high rated voltage MISFET, and a second conductivity type high rated voltage MISFET, which method comprises the steps of forming a well of the second conductivity type in a surface of the substrate corresponding to drain regions of the first conductivity type low rated voltage MISFET and the second conductivity type high rated voltage MISFET, forming an oxidation-proof film on the surface of the substrate, removing oxidation-proof film portions in regions corresponding to a region for electrical isolation of each MISFET and drain regions of the first conductivity type and second conductivity type high rated voltage MISFETS, doping an impurity element of the first conductivity type into the surface of the substrate corresponding to the isolation region between the low rated voltage MISFETs of the second conductivity type and a drain region of the high rated voltage MISFET of the first conductivity type, forming a field oxide film by selective oxidation of the surface of the substrate with the oxidation-proof film being as a mask, removing the oxidation-proof film, forming a gate insulation film on the surface of the substrate without having the field oxide film, patterning a gate electrode of each MISFET on the gate insulation film, forming source and drain regions of the low rated voltage MISFET of the first conductivity type, and forming source and drain regions of the low rated voltage MISFET of the second conductivity type.

(3) A semiconductor device is provided which is featured by comprising spaced-apart source and drain regions of a second conductivity type provided in a surface of a semiconductor substrate of a first conductivity type, a channel formation region which is a surface of the semiconductor substrate between the source region and the drain region, a gate region formed in the surface of the semiconductor substrate as spaced apart from the source and drain regions, and an intermediate gate electrode above the channel formation region with a gate insulation film being provided between the intermediate gate electrode and the channel formation region, wherein the threshold voltage of the gate region for inverting the channel formation region is at a constant value.

(4) The semiconductor device is arranged such that a capacitance CG between the gate region and the intermediate gate electrode and a total capacitance CT regarding the intermediate gate electrode satisfies a relation defined by CG/CT<0.55.

(5) In the semiconductor device of (3), voltage reset means is connected to the intermediate gate electrode.

(6) In the semiconductor device of (3), the channel formation region includes a plurality of threshold-value controlling impurity regions provided therein.

(7) The semiconductor device of (3) is arranged so that it controls the threshold voltage by fine analog adjustment of the threshold voltage by use of a miniaturized planar pattern wherein an individual threshold-value controlling impurity region measures 2 μm or below in length along either the direction of channel width or the direction of channel length thereof.

(8) In the semiconductor device of (3), a capacitance CD between the drain region and the intermediate gate electrode is smaller in value than a capacitance CS between the source region and the intermediate gate electrode, thereby decreasing potential variations at the intermediate gate electrode due to the drain voltage to improve the short channel effect thereof.

(9) The drain region includes a first drain region consisting of a heavily doped region of the second conductivity type, and a second drain region consisting of a lightly doped region of the second conductivity type as provided between the first drain region and the channel formation region. In the case where a drain voltage is applied to the first drain region, the second drain region is depleted at its surface. Any possible potential variations at the intermediate gate electrode due to application of the drain voltage is decreased by reducing CD by letting an insulative film between the intermediate gate electrode and the second drain region be effectively thick so that it is the sum of the gate insulation film and a depletion layer.

(10) An insulative film is formed between the drain region and the intermediate gate electrode to be thicker than the gate insulation film, thereby reducing CD. With such a reduction of CD, potential variations at the intermediate gate electrode due to application of the drain voltage is decreased.

(11) A high rated voltage gate region consisting of a lightly doped region which is the same in conductivity type as the gate region is provided so as to surround the gate region, thus enabling application of high voltage to the gate region.

(12) A semiconductor device is arranged which comprises spaced-apart source and drain regions of a second conductivity type provided in the surface of a semiconductor region of a first conductivity type, a channel formation region being part of the surface of the semiconductor region between the source region and the drain region, a first gate insulation film formed on the surface of the channel formation region, an intermediate gate electrode provided above the channel formation region with the first gate insulation film being sandwiched therebetween, a gate region provided to be capacitively coupled to the intermediate gate electrode through a second gate insulation film, and voltage set means provided and connected for supplying carriers to the intermediate gate electrode.

(13) The semiconductor device according to (12) is featured in that the gate region is provided above the intermediate gate electrode.

(14) The semiconductor device according to (12) is featured in that a plurality of gate regions are provided.

(15) The semiconductor device according to (14) is featured in that a plurality of gate regions are provided, and that a capacitance between each gate region and the intermediate gate electrode has a different value.

(16) A semiconductor device is provided which comprises spaced-apart source and drain regions of a second conductivity type provided in the surface of a semiconductor region of a first conductivity type, a channel formation region that is part of the surface of the semiconductor region between the source region and the drain region, a first gate insulation film formed on the surface of the channel formation region, an intermediate gate electrode provided on or above the channel formation region with the first gate insulation film being sandwiched therebetween, a gate region provided to be capacitively coupled to the intermediate gate electrode through a second gate insulation film, and a thin-film transistor serving as voltage set means provided and connected for supplying carriers to the intermediate gate electrode.

In FIG. 1 a drain region 4C of HVNMOSFET and an N well 2 of PMOSFET are formed simultaneously by diffusion of the same impurity concentration region. A drain region 3C of HVPMOSFET and a field dope region 6 underlying the isolation region of NMOSFET are formed simultaneously by diffusion of the same impurity concentration region. Therefore, it becomes possible to manufacture the HVP-MOSFET and HVNMOSFET without requiring any additional steps other than the steps of forming LVPMOSFET and LVNMOSFET.

By providing an intermediate gate electrode (intermediate gate region) between a gate region (gate electrode) being applied with a drive voltage and a channel region, an application voltage to the gate insulation film is a low voltage potentially divided from the gate voltage. It is thus possible to make the gate insulation film thinner while enabling common arrangement of the high voltage driven MISFET and low voltage driven MISFET.

BRIEF DESCRIPTION OF DRAWINGS

FIG. 4 is a cross-sectional view of a semiconductor device of the present invention.

FIG. 14 is a plan view of a high-voltage driver MISFET in accordance with another embodiment of the present invention.

DETAILED DESCRIPTION

Figure 1:
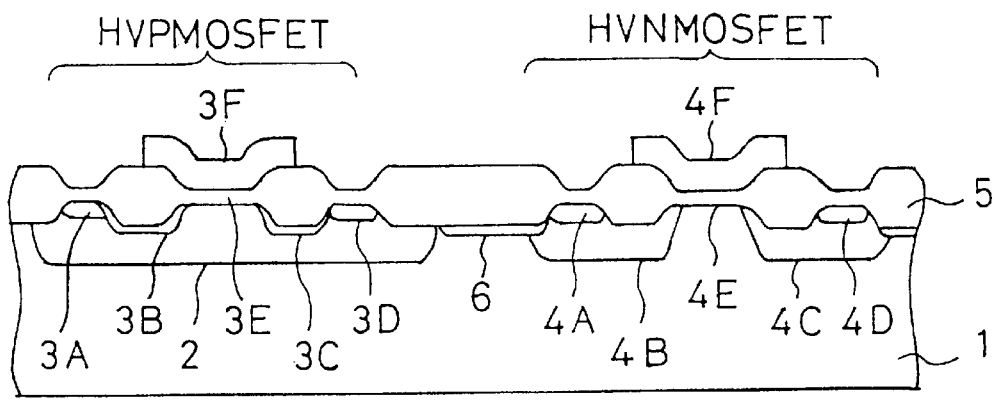
FIG. 1 is a cross-sectional view of a semiconductor device of the present invention.
Figure 2:
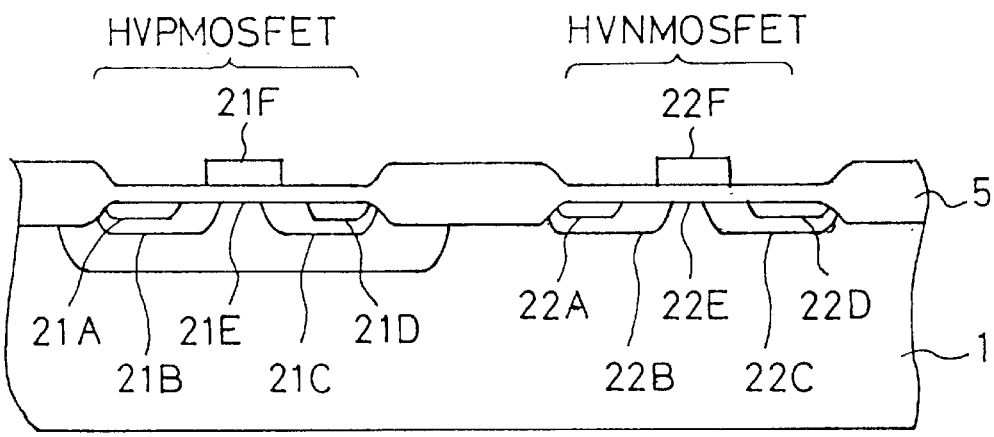
FIG. 2 is a cross-sectional view of a semiconductor device in the prior art.
Figure 3:
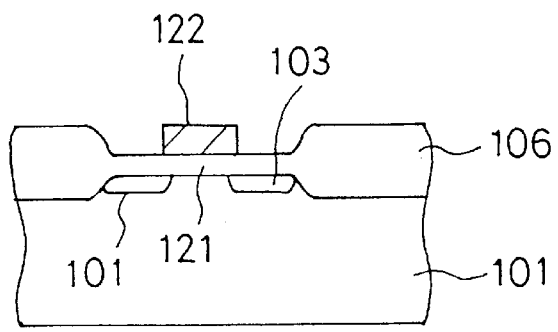
FIG. 3 is a cross-sectional view of a prior art semiconductor device.

FIG. 1 is a cross-sectional view of an HVPMOSFET and an HVNMOSFET which constitute a high voltage inverter circuit of the present invention.

The HVNMOSFET is formed in the surface of a P type silicon substrate 1. Also formed in the surface of substrate 1 is an N well 2 having its surface in which the HVPMOSFET is formed. The drain region of HVNMOSFET is constituted from a lightly doped drain region 4C of the same impurity concentration as that of the N well 2, and a heavily doped drain region 4D provided in the inside surface thereof. The term "heavily doped" means any required impurity density or concentration to attain an ohmic contact with its associated wiring line, which may be at least $10^{19}$ atoms/cm$^3$ or more irrespective of whether the conductivity type is P or N type. The term "lightly doped" means an impurity concentration less than the above-defined high concentration: in the present invention, it preferably ranges in value from $10^{16}$ to $10^{18}$ atoms/cm$^3$. Additionally, the source regions are similar in structure to the drain regions.

A thick field oxide film 5 is arranged between the lightly doped drain region 4C and the gate electrode 4F to a thickness of from 3,000 to 15,000 Å. A gate insulation film 4E is less in thickness than the field insulation film 5, and ranges from 200 to 2,000 Å. The drain region of HVMOSFET is formed simultaneously with formation of a field dope region 6 acting as the isolation region between LVNMOSFETs, and is comprised of a lightly doped drain region 3C and a heavily doped drain region 3D which is provided at the substrate surface to be connected to the lightly doped drain region 3C. The source region of HVPMOSFET is substantially the same in structure as the drain region: it consists of a lightly doped source region 3B and a heavily doped source region 3A. A field oxide film is formed on the lightly doped drain region 3C and lightly doped source region 3B in such a manner that the film is self-aligned with them. Since the heavily doped source region 3A and drain region 3D are formed with the field oxide film 5 being as a mask therefor, these are similarly disposed such that they are self-aligned with the field oxide film 5. Likewise, the heavily doped source region 4A and drain region 4D of HVNMOSFET are disposed so that these are self-aligned with the field oxide film 5. Electrical isolation between HVNMOSFETs is accomplished by providing the same region as the heavily doped source region 3A of PMOSFET as necessary.

FIG. 4 is a cross-sectional view of an LVPMOSFET and an LVNMOSFET constituting a low voltage inverter circuit of the present invention.

These LVPMOSFET and LVNMOSFET are also formed in the surface of the same substrate 1 in which the HVPMOSFET and HVNMOSFET are formed. The LVPMOSFET is formed at the surface of the N well 2 formed in the surface of the substrate 1, whereas the LVNMOSFET is in the surface of the substrate 1. While the operating voltage of the high voltage inverter circuit is a high rated power supply voltage of 10 V or above, the low voltage inverter circuit operates with a low power supply voltage of 5 V or below. Typically, it is 5 V.

The LVPMOSFET includes a heavily doped source region 31A, a heavily doped drain region 31B, and a gate electrode 31C which overlies a channel formation region at a surface portion defined between the source and drain regions with a gate insulation film 31C being sandwiched between the surface and the gate electrode 31C. The LVNMOSFET includes spaced-apart heavily doped source region 32A and drain region 32B, and a gate electrode 32D overlying a channel formation region at a surface portion defined therebetween with a gate insulation film 32C being laid between the channel formation surface and the gate electrode 32D. Electrical isolation between respective LVN-MOSFETs is attained by use of the field dope region 6 that is a P type diffusion layer underlying the field oxide film 5.

The N well 2 of LVPMOSFET is formed at the same steps of for fabrication of the lightly doped drain region 4C of HNMOSFET shown in FIG. 1. Accordingly, such regions are the same in impurity concentration. The field dope region 6 constituting the isolation region between LVN-MOSFETs is formed during the same fabrication steps for the lightly doped drain region 3C of HVPMOSFET of FIG. 1. These regions are also the same in impurity concentration. The gate insulation films 31C, 32C of the low voltage inverter circuit are so formed as to be thinner than the gate insulation films 3E, 4E of the high voltage inverter circuit. The transistors of low voltage inverter circuit are formed of normally dense drain regions 31B, 32B due to unnecessity of high rated voltage characteristics. These dense drain regions 31B, 32B are formed at the same fabrication steps of dense drain regions 3D, 4D of the high voltage inverter circuit.

FIG. 5 shows several cross-sections at main steps of a manufacturing method of the high voltage inverter circuit.

Figure 5A:
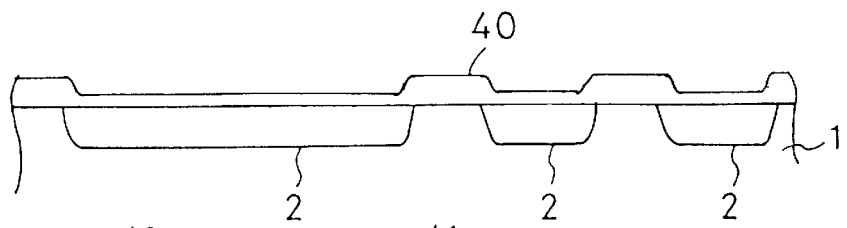
FIGS. 5A–5F are cross-sectional views at the main manufacturing steps of the semiconductor device of the present invention.
Figure 5B:
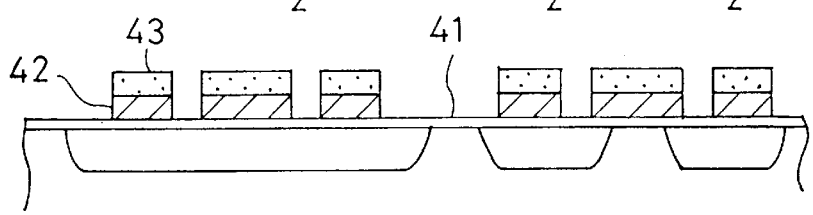

As shown in FIG. 5(a), a part of a mask film is first removed away by well-known photolithography techniques from the surface of the P type substrate 1 in which an N well is to be formed. With such mask film being as a mask, a chosen N type impurity such as phosphorus element is doped using ion implantation techniques. Thermal diffusion is then performed for 15 hours at 1,150° C., thus forming an N well region 2. The N well region 2 is formed in any areas corresponding to the lightly doped drain region of HVN-MOSFET as well as those of the LVPMOSFET and HVP-MOSFET.

Then, the mask film 40 is removed away. Next, an oxide film 41 of 500 Å thick and a silicon nitride film 42 of enhanced heat resistance are formed sequentially; thereafter, a resist film 43 is also formed thereon. The resist film 32 on the surface of the substrate 1 whereat a field oxide film is to be formed is subject to patterning using known photolithography techniques. Further, with the resist film 43 being as a mask, the silicon nitride film 42 is selectively etched to form a structure of FIG. 5(b). The field oxide film formation region covers not only the isolation regions between respective transistors but also any substrate surface regions corresponding to respective lightly doped drain regions of HVPMOSFET and HVNMOSFET.

Figure 5C:
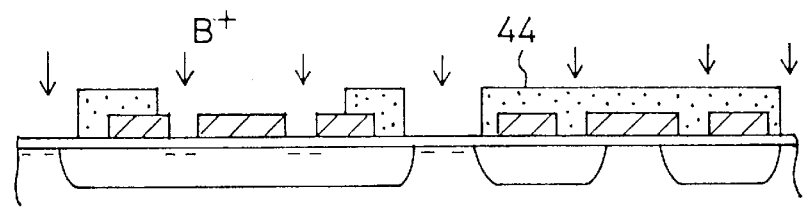

Next, as shown in FIG. 5(c), another resist film 44 is patterned, and a chosen P type impurity such as boron element is then ion-implanted. Ion implantation is carried out with the resist film 44 and the silicon nitride film 42 being as a mask. The target region of this ion implantation is set at certain surface portions of the substrate 1 which correspond to the isolation regions between LVNMOSFETs and those between HVMOSFETs and exclude the N well 2. Further, in the N well 2, it may also be an ion implantation step for fabricating the lightly doped drain region of HVPMOSFET. The injection rate of boron is $10^{12}$ to $10^{13}$ atoms/cm$^2$.

Figure 5D:
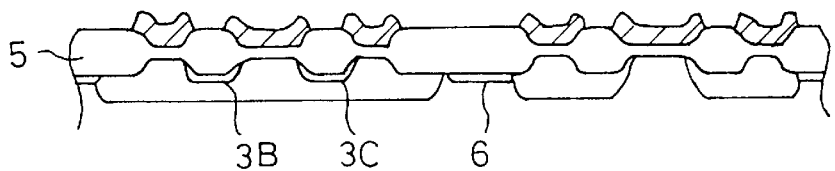

Next, with the silicon nitride film 42 as a mask, the substrate 1 is subject to a selective oxidation process at 1,000° C., forming a field oxide film 5 as shown in FIG. 5(d). At this time, the boron element as doped at the step of FIG. 5(c) is thermally diffused causing a field dope region 6 to be formed between HVNMOSFET and LVNMOSFET just beneath the field oxide film 5. A lightly doped drain region 3C of HVPMOSFET is also formed beneath the field oxide film 5 to be self-aligned with it. In addition, a field oxide film is formed on the lightly doped drain region of HVNMOSFET. The field oxide film 5 is formed such that it is several times thicker than a gate insulation film to be formed later. Typically, it measures 3,000 to 15,000 Å in thickness.

Figure 5E:
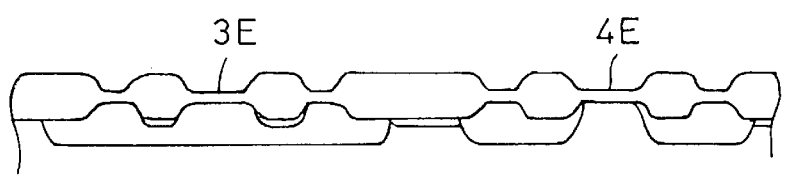
Figure 5F:
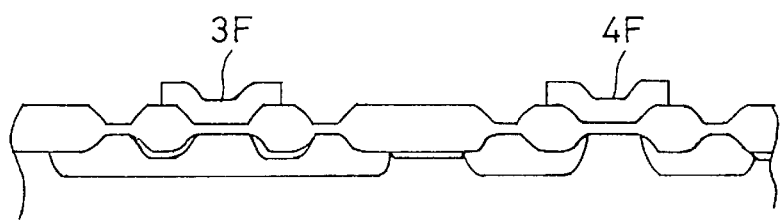

Next, the silicon nitride film 32 and the oxide film 42 are sequentially removed away thus exposing the surface of the substrate 1 in certain regions excluding the field oxide film 5. As shown in FIG. 5(e), gate insulation films 3E, 4E are deposited on such exposed surface of the substrate 1. Gate insulation films for the low voltage inverter circuit are formed at this step. In the case where the gate insulation films of the low voltage inverter circuit are formed to be thin, gate insulation films are again formed after removal of the gate insulation films 3E, 4E of the low voltage inverter circuit again. The gate insulation films of the high voltage inverter circuit are 200 to 2,000 Å in thickness, whereas the gate insulation films of low voltage inverter circuit measures 100 to 400 Å in thickness.

Subsequently, a polycrystalline silicon is formed as a gate electrode on the surface of the substrate 1. Known photolithography techniques may be used to pattern the polysilicon film thus forming gate electrodes 3F, 4F on the gate insulation films. At this time, gate electrodes for the low voltage inverter circuit are formed simultaneously.

Next, with the field oxide film gate electrodes and a resist film being as a mask not shown in the drawing, a chosen N type impurity such as arsenic element is doped by ion implantation thus forming heavily doped source and drain regions of LVNMOSFET and HVNMOSFET. Further, while not shown, a chosen P type impurity such as boron element is ion-implanted at $10^5$ atoms/cm$^2$ or above, with the gate electrodes and the resist film being as the mask therefor, so that heavily doped source and drain regions of LVPMOSFET and HVPMOSFET are formed. Then, after forming an oxide film of 5,000 Å thick as an intermediate insulation film, contact holes are formed by use of the resist film as a mask in selected regions for making contact with associated wiring lines. An aluminum film serving as wiring lines is then patterned on the contact holes. A protective film made of a plasma silicon nitride film is formed to finally obtain a semiconductor device as shown in FIG. 1.

Figure 6:
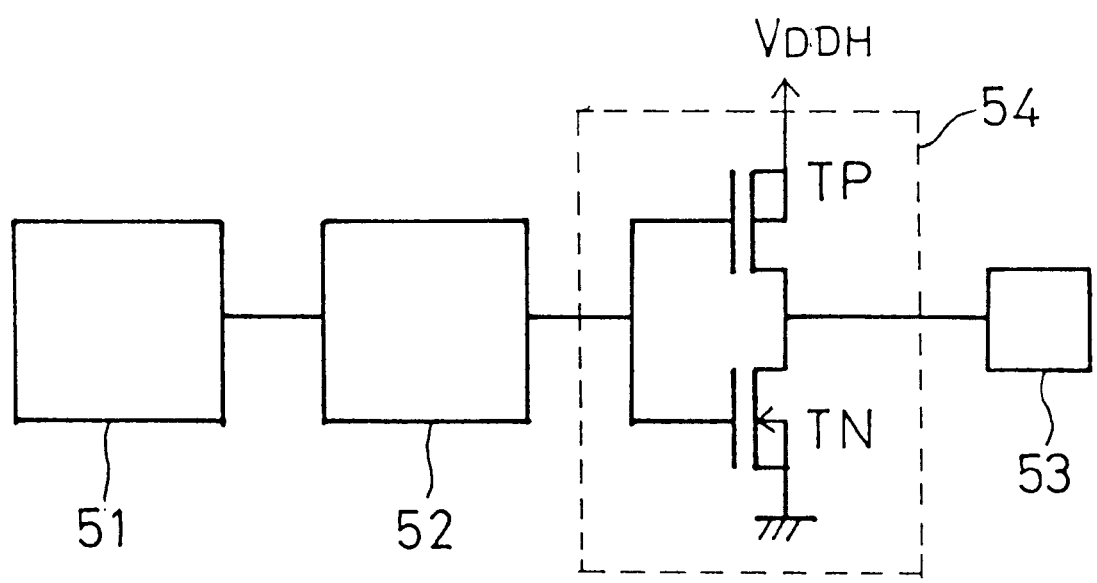
FIG. 6 is an electrical circuit diagram of a semiconductor device of the present invention.

FIG. 6 is an electrical circuit diagram of the semiconductor device of the present invention.

The circuit shown consists of a control circuit 51 for an output high voltage inverter circuit 51 including a low voltage inverter circuit, a level-shift circuit 52 for converting a low power supply voltage that is an output voltage of the control circuit 51 into a high power supply voltage, a high voltage inverter circuit 54 controlled by an output of the level-shift circuit 52, and an output pad terminal 53 connected to an output of the high voltage inverter circuit 54. The control circuit is driven by a low voltage power supply of 5 V. The level-shift circuit 52 and high voltage inverter circuit 54 are driven by a high voltage power supply VDDH of 40 V. A voltage of from 0 to 40 V is supplied from the output pad terminal and is applied to a liquid crystal. The high voltage inverter circuit 54 includes a series connection of an HVPMOSFET TP and an HVNMOSFET TN between a power supply VDDH and a VSS line.

Other embodiments of the present invention will now be described with reference to the accompanying drawings.

Figure 7:
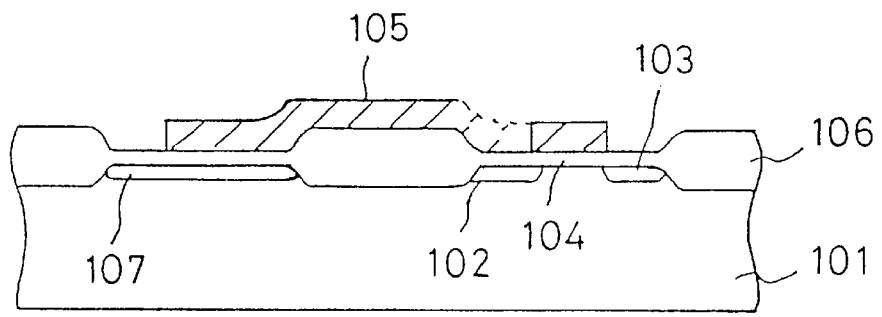
FIG. 7 is a cross-sectional view of a semiconductor device of the present invention.

FIG. 7 is a cross-sectional view of a semiconductor device of the present invention.

This embodiment is an N type MOSFET as provided in the surface of a P type silicon substrate 101. Principally, the silicon substrate 101 may alternatively be a thin film provided on another substrate.

An N type source region 102 and a drain region 103 are provided in the surface of the P type substrate 101 such that these regions are spaced apart from each other. A surface portion of the substrate 101 defined between the source region 102 and the drain region 103 serves as a channel formation region. Furthermore, an N type gate region 107 is provided in the substrate surface such that it is distant from the source region and the drain region 103. An intermediate gate electrode 105 is arranged above the gate region 107 and the channel formation region with a gate oxide film 104 being laid therebetween. Applying a voltage to the gate region 107 controls the flow of a channel current between the source region 102 and the drain region 103. Now representing a capacitance between the gate region 107 and the intermediate gate electrode 105 as "CC," and a total capacitance around the intermediate gate electrode 105 as "CT," a voltage VMG of the intermediate gate electrode 105 is then defined as follows.

$$VMG=CG/CT\cdot VG+CD/CT\cdot VD \qquad (1)$$

where VG is an application voltage to the gate region 107, and VD is that to the drain region 103. CD is the capacitance between the intermediate gate electrode 105 and drain region 103. Here, CT is defined as follows.

$$CT=CG+CS+CD+CCH+a \qquad (2)$$

where CS and CCH are respective capacitances of the source region 102 and the channel formation region for the intermediate gate electrode 105. a is the capacitance between the intermediate gate electrode and another region (for example, a parasitic capacitance between it and the substrate, or a capacitance between it and a voltage reset means as will be described with later embodiments).

From Equation (1), the voltage VMG of the intermediate gate electrode 10S is decreased due to potential division by a capacitive coupling ratio with respect to the application voltage VG. For instance, assuming that CG/CT=0.5, CG=CD, then VMG=½ VG. In this case, a voltage for the gate oxide film 104 is half the application voltage. Accordingly, appropriate design choice of CG/CT<0.55 enables the thickness of the gate oxide film to be decreased at 50% of the conventional value. As the value of CG/CT gets closer to 1 or 0 from 0.5, the application of a voltage is concentrated upon either one of the gate insulation film between the gate region 107 and the intermediate gate electrode, and the gate insulation film between the channel formation region and the intermediate gate electrode 105. Therefore, it is suitable for achievement of thinner films to design CG/CT to fall within a range of 0.5 0.1.

Figure 8:
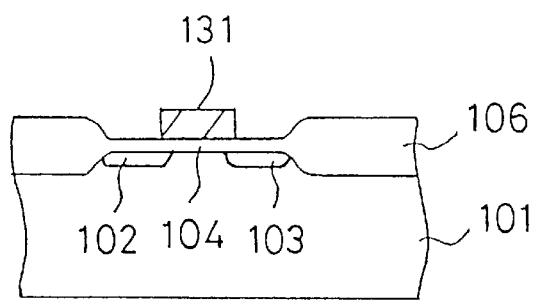
FIG. 8 is a cross-sectional view of a semiconductor device of the present invention.

FIG. 8 is a cross-sectional view of a low voltage driven MISFET as formed on the same substrate. While the embodiment of FIG. 7 is a high voltage driven MOSFET, the low voltage driven MOSFET of FIG. 8 directly controls the channel formation region by application of a voltage to the gate electrode 131. The gate insulation film 104 is formed at the same fabrication steps as for the gate insulation films of the high voltage driven MOSFET. Therefore, the both films are the same in thickness. For example, in the low voltage driven MOSFET of FIG. 8, in the case where a 3-V power supply voltage is applied to the gate electrode 131, the gate oxide film 104 is deposited to a thickness of 100. In the situation where the high voltage driven MOSFET of FIG. 8 is on the same substrate 101, the use of a gate oxide film of 100 thick enables application of a drive voltage of 5 V or above.

Figure 9:
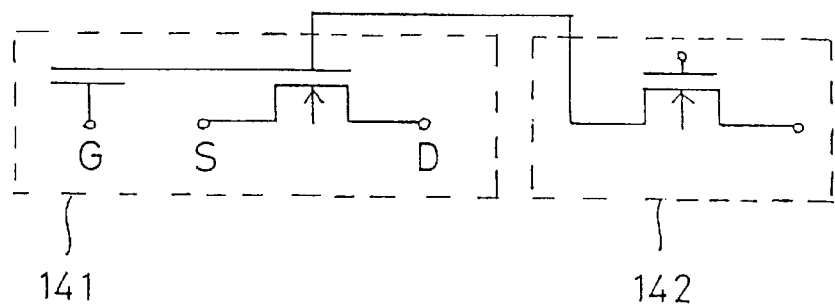
FIG. 9 is an electrical circuit diagram of a semiconductor device of the present invention.

FIG. 9 is an electrical circuit diagram of an embodiment of the semiconductor device of the present invention employing a voltage set means in order to provide stable operations. A broken line 141 is used to designate the MOSFET of FIG. 7, whereas a broken line 142 indicates such voltage set means wherein a known MOSFET is used. In the semiconductor device of FIG. 7, upon application of a voltage to the gate region 107, the impedance of channel formation region is indirectly controlled by the capacitive coupling by way of the intermediate gate electrode 105. Accordingly, when electrical carriers are injected into the intermediate gate electrode 105 from its peripheral regions, the resulting operation will possibly become unstable due to the occurrence of charge-up phenomenon. Then, as shown in FIG. 9, it is possible by specifically providing the intermediate gate electrode with the voltage set means to prevent such unstable operations from taking place due to charge-up phenomenon. More specifically, at an OFF time, the voltage at the intermediate gate electrode is forced by the voltage set means in the grounded state. At an ON time, the MOSFET of the voltage set means is turned off causing stable operations to be attained by the application voltage to the gate region.

Incidentally, since the high voltage driven MISFET (referred to as "HVMISFET" hereinafter) and low voltage driven MISFET (referred to as "LVMISFET") are different from each other in net electrical capacitance per unit area, the resulting threshold value is different with respect to the gate regions thereof.

Consequently, in order to control the threshold voltages, different impurity regions are separately introduced into respective channel formation regions thereby providing control as required. However, it is possible to control the threshold voltages of respective MISFETs at a time by employing a single impurity introduction step using a specific method as will be described below.

Figure 10A:
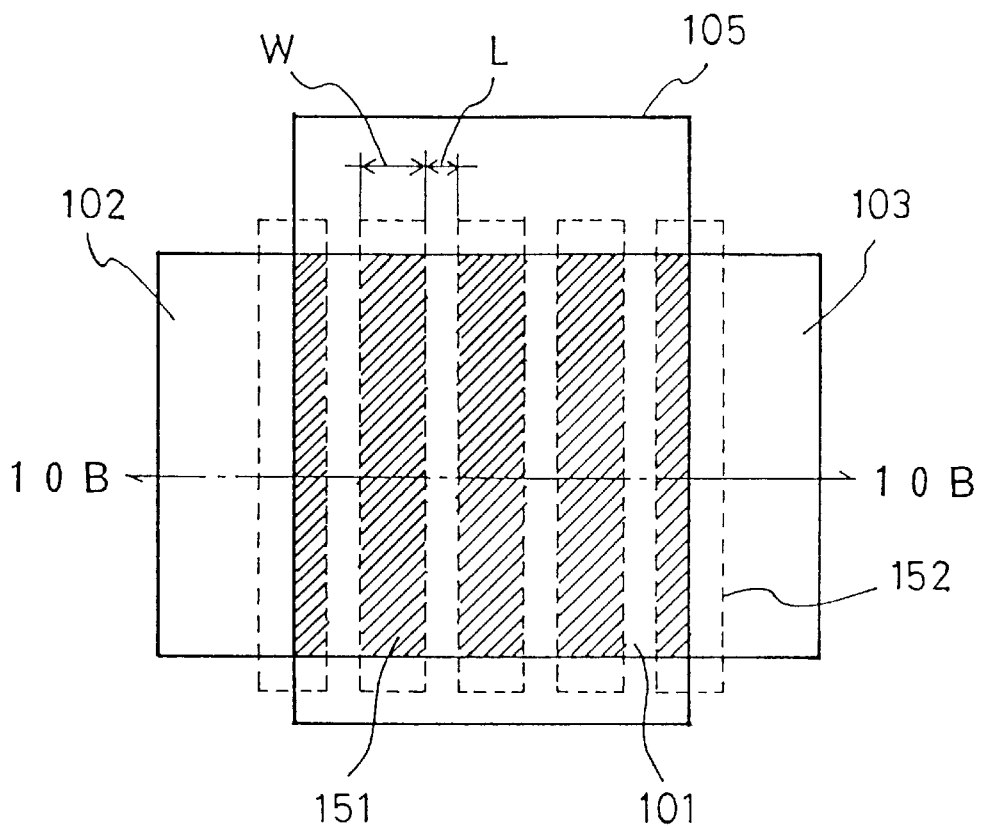
FIG. 10(a) is a plan view of a high-voltage drive MISFET around an intermediate gate electrode thereof.
Figure 10B:
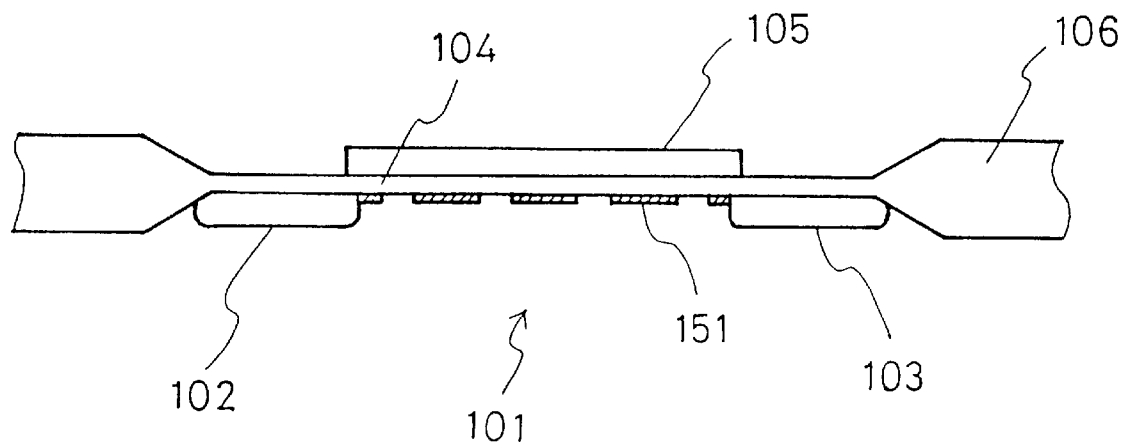
FIG. 10(b) is a cross-sectional view along line A–A' of FIG. 10(a).
Figure 11A:
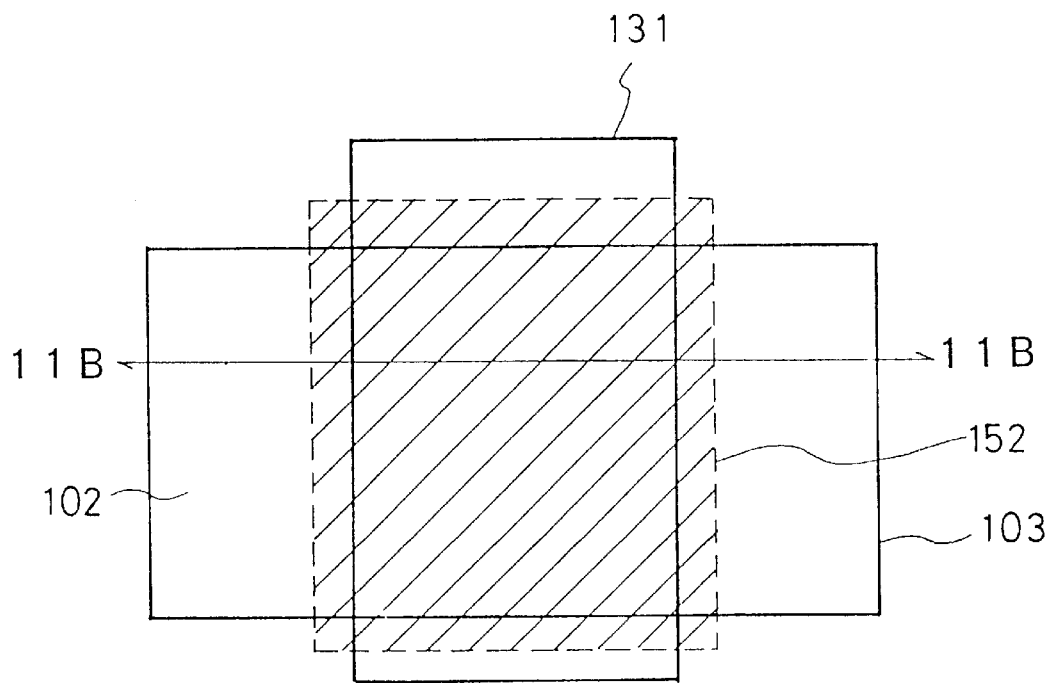
FIG. 11(a) is a plan view of a low-voltage driver MISFET.
Figure 11B:
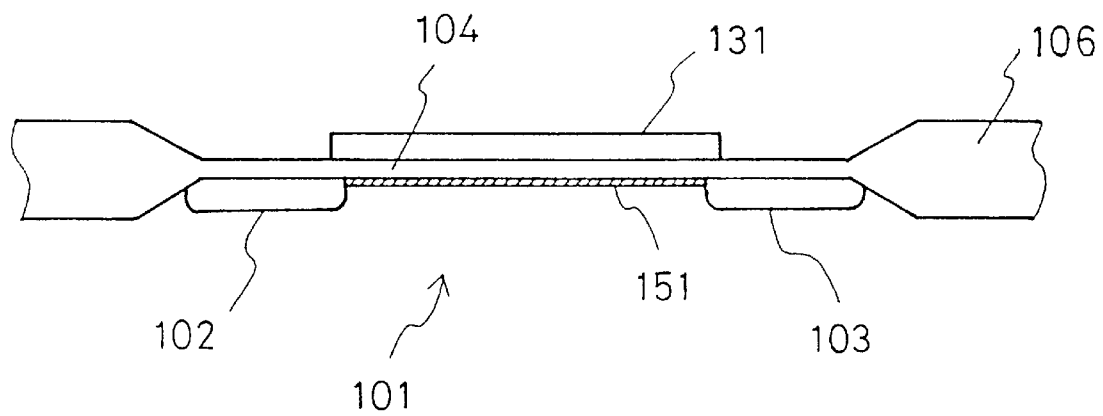
FIG. 11(b) is a cross-section at line B–B' of FIG. 11(a).

FIG. 10(a) and FIG. 10(b) are a plan view and a cross-sectional view of an intermediate gate electrode section of an HVMISFET embodying the present invention. FIG. 10(b) is a cross-section along the line A–A' of FIG. 10(a). While the intermediate gate electrode 105 per se is not shown therein, this electrode is provided and capacitively coupled with the gate region as shown in FIG. 7. A plurality of threshold-value controlling impurity regions 151 doped with a chosen P type impurity therein are formed in the channel formation region between the source region 102 and drain region 103 in the surface of the substrate 101 beneath the intermediate gate electrode 105. These impurity regions 151 consist of parallel elongate portions of width W extending in the direction of channel width at intervals L therebetween. A pattern 152 corresponds to a resist mask pattern as used when impurity regions are formed by channel doping techniques using the ion implantation process. On the other hand, a pattern of such impurity regions 151 for the LVMISFET is arranged as shown in FIG. 11(a) and FIG. 11(b). FIG. 11(b) is a cross-sectional view along the line B–B' of FIG. 11(a). An impurity region 151 is provided over the entire surface of the channel formation region at the surface of the substrate 101 beneath the gate electrode 131, thereby controlling the threshold voltage toward its enhance side. The impurity regions 151 of HVMISFET and LVMISFET are formed simultaneously at the same fabrication step. Since the impurity regions 151 of HVMISFET are formed so that these occupy limited areas of the channel formation region at a fixed ratio, the resulting threshold value control width is kept smaller than that in the case of entire fabrication thereof. In other words, it becomes possible to control the threshold voltage by changing the area of impurity region 151 relative to the entire area of channel formation region. With suitable selection of the area ratio of the impurity regions 151, the threshold value control can be carried out for both the HVMISFET and the LVMISFET without requiring any extra steps other than a single impurity introduction step. Preferably, a miniaturized pattern is employed with at least one of the width W and interval L of the impurity regions 151 being 4 µm or less. Typically, 2 µm or less is desirable; if microfabrication techniques are available, selection of 1 µm or less is most preferable in view of the electrical characteristics of transistors.

Figure 12:
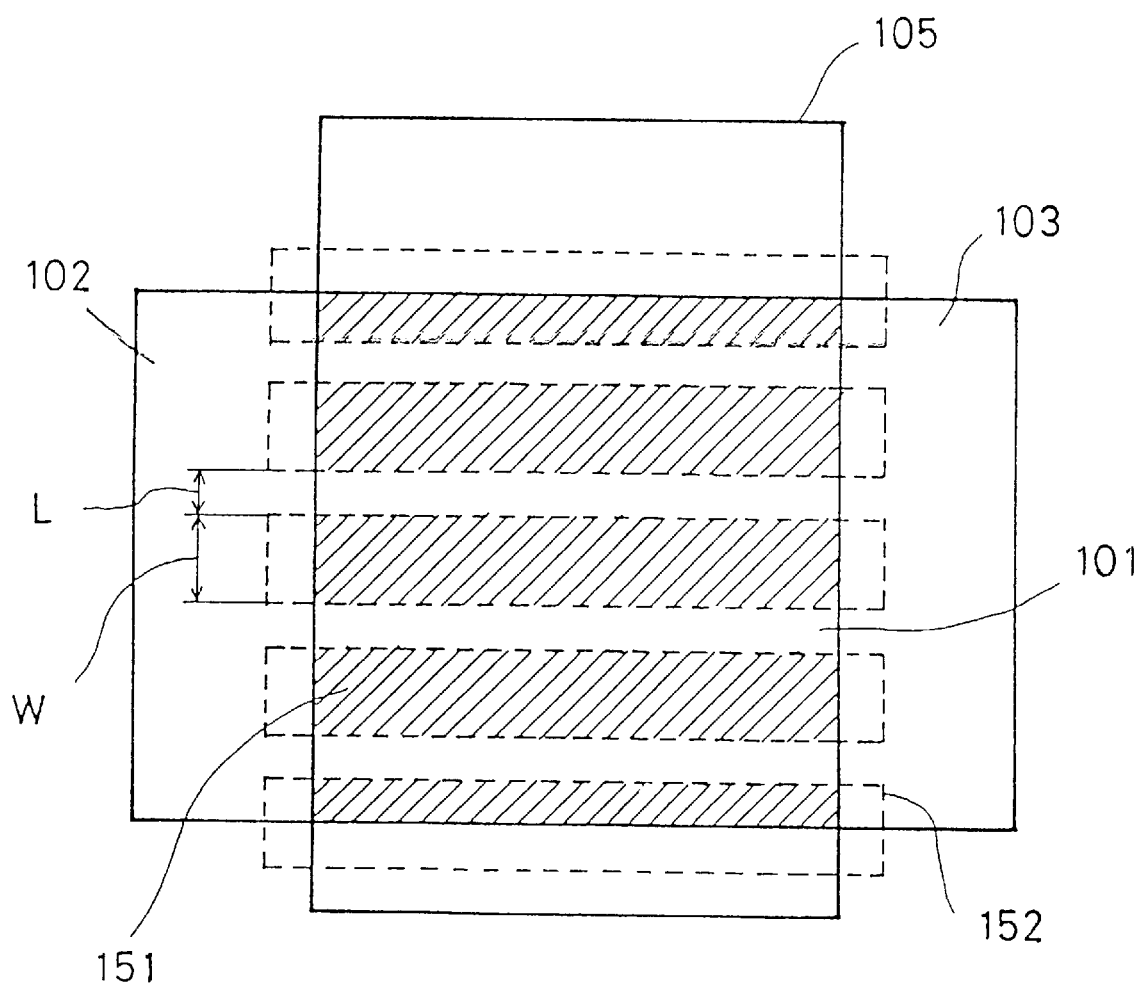
FIG. 12 is a plan view of a high-voltage driver MISFET in accordance with another embodiment of the present invention.
Figure 13:
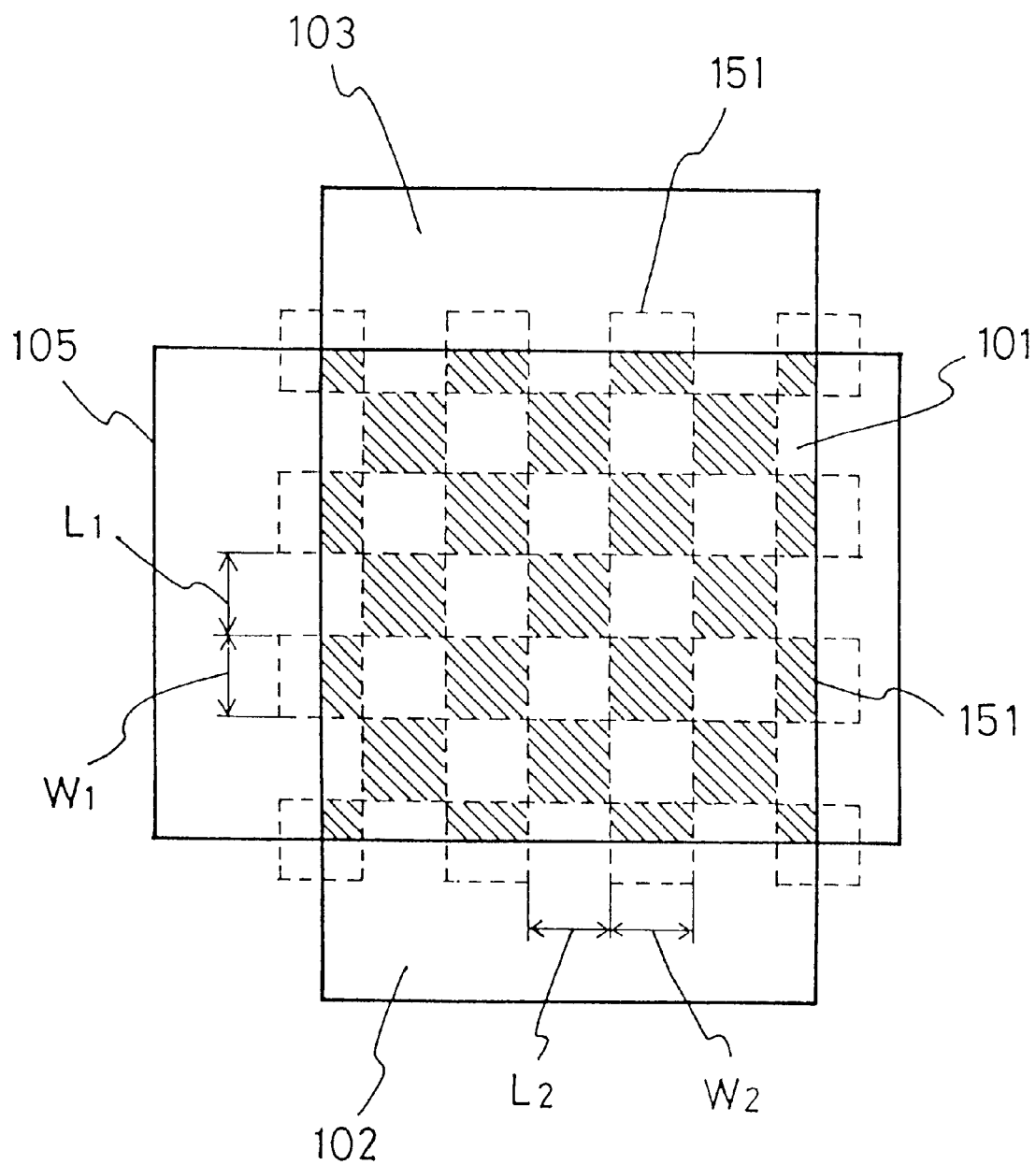
FIG. 13 is a plan view of a high-voltage driver MISFET in accordance with another embodiment of the present invention.

FIG. 10 shows an embodiment with a plurality of parallel impurity regions 151 extending in the channel width direction. FIG. 12 is another embodiment of the HVMISFET, wherein the impurity regions 151 are arranged so as to extend in parallel with the direction of channel length. FIG. 13 and FIG. 14 are plan views of other embodiments of the HVMISFET of the present invention. The impurity regions 151 are arranged to define a dot-like pattern.

In each embodiment of HVMISFETs of FIG. 10, FIG. 12, FIG. 13 and FIG. 14, at least one of the width W and interval L of the impurity regions exhibits a miniaturized pattern that measures 4 μm in maximum, typically 2 μm or less, preferably 1 μm or below. By controlling the channel formation region of HVMISFETs relative to the area ratio of impurity regions thereof, it is possible to simultaneously control respective threshold voltages of HVMISFET and LVMISFET by use of one impurity introduction step.

The threshold voltages thus controlled can also be controlled to be almost equal to each other. Alternatively, it is easy to control the threshold voltage of HVMISFET to be shifted by 0.1 to 0.3 V toward the enhance side thereof by use of LVMISFET. In addition, the threshold voltage becomes a function of CG/CT in the light of Equation (1). Accordingly, even when more than two kinds of CG/CT, i.e., more than two types of HVMISFETs, are provided on the same substrate, it is possible to control the threshold voltages in such a manner that they are substantially the same as each other by controlling the area ratio of impurity region.

Figure 15:
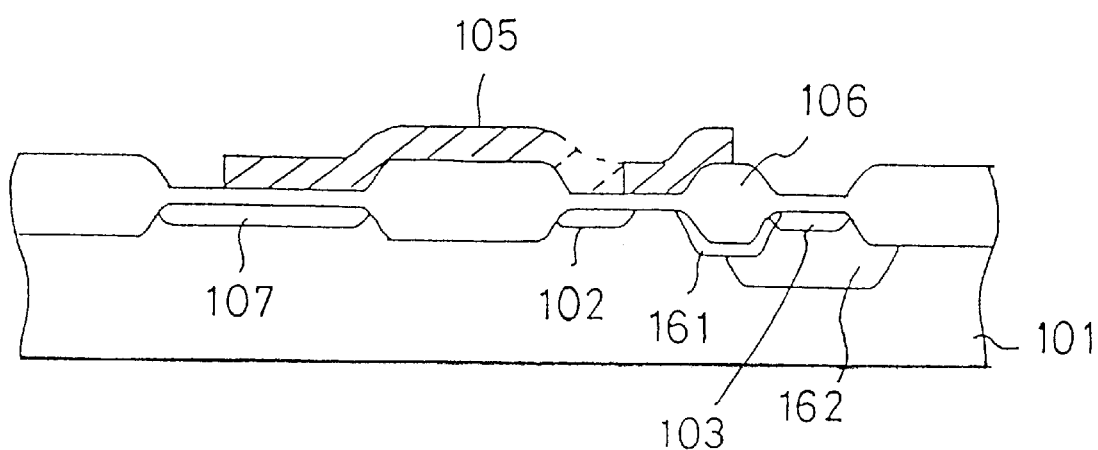
FIG. 15 is a cross-sectional view of a semiconductor device in accordance with another embodiment of the present invention.

In the semiconductor devices embodying the present invention, it can be understood from Equation (1) that the voltage VMG of the intermediate gate electrode 105 is a function of the drain voltage VD. In the case of ordinary MISFETs, the drain current exhibits the saturation characteristic relative to a drain voltage applied. However, in the semiconductor devices of the present invention, the saturation characteristic will be deteriorated due to the fact that VMG is also increased as the drain voltage VD potentially increases. Furthermore, even when the application voltage VG to the gate region 107 is under the zero-bias condition, VMG becomes greater in potential than the threshold voltage when a high voltage is applied as the drain voltage VD, resulting in a problem in that an OFF leak current flows undesirably. FIG. 15 illustrates in cross-section a semiconductor device in accordance with a further embodiment of the present invention, which suppress adverse influence of VMG by the drain voltage VD. A lightly doped drain region 161 of N type conductivity is provided between the heavily doped N type drain region 103 and its associated channel formation region in the surface of the P type substrate 101. The drain region, which is arranged in the surface of the substrate 101 so as to overlap the intermediate gate electrode 105 through the gate insulation film 104, is formed of a lightly doped.impurity region thus enabling CD of Equation (1) to be rendered smaller in value. More specifically, when the drain voltage VD is applied to the drain region 103, the lightly doped drain region 161 laid just beneath the intermediate gate electrode 105 is depleted at the surface thereof. Accordingly, since any insulative film between the intermediate gate electrode 105 and the lightly doped drain region 161 is comprised of the gate insulation film and such depletion layer, its capacitance is smaller than CD. Generally, the surface density of the lightly doped drain region 161 is set at $10^{16}$ to $10^{18}$ atoms/cm$^3$ as a value for enabling achievement of depletion. As in FIG. 15, it becomes possible by providing another lightly doped drain region 162 that surrounds the heavily doped drain region 103 to further increase the rated voltage of drain, also. By further reducing CD to CD<CS as shown in FIG. 15, it is possible to decrease the amount of influence of the voltage VMG of intermediate gate electrode 105 due to the drain voltage VD. In other words, the intermediate gate electrode 105 can eliminate the occurrence of a decrease in rated voltage, an increase in OFF leak and an increase in short-channel effect due to the capacitive coupling with the drain region. Moreover, in the embodiment of FIG. 15, the insulative film between the intermediate gate electrode 105 and the drain region is formed of a field insulation film 106. Since the field insulation film 106 is deposited to an increased thickness of ten times greater than that of the gate insulation film 104, CD can be decreased at 1/10 or less. As in the embodiment of FIG. 15, CD can easily be decreased for more than one order of magnitude by causing the drain region to be lightly doped while forming the insulation film on the drain region 161 to be thicker than the gate insulation film 104. In the case of the embodiment of FIG. 15, the source region 102 has a prior known structure; however, this source region 102 may alternatively be formed to be symmetrical in structure with its associated drain region. As can be seen from Equation (1), such reduction of CD may provide some effect. Letting the source region be the same in structure as the drain region enables CS to decrease. Such reduction of Cs may advantageously contribute to the possibility of forming a device structure with enhanced controllability of CG/G.

Figure 16:
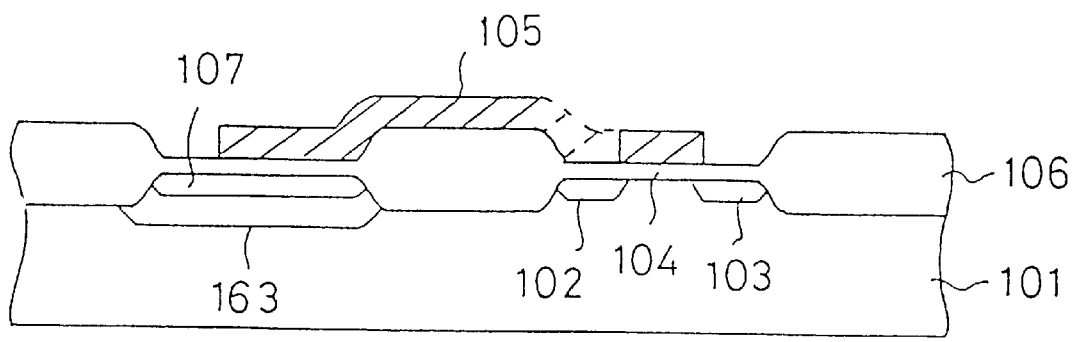
FIG. 16 is a cross-sectional view of a semiconductor device in accordance with another embodiment of the present invention.

FIG. 16 is a cross-sectional view of a semiconductor device in accordance with a further embodiment of the present invention. A high rated voltage gate region 163 consisting of a lightly doped N type impurity region is provided to surround the gate region 107 consisting of a heavily doped N type impurity region. By rendering a lightly doped N type gate region sandwiched between the heavily doped N type gate region 107 and the substrate 101, the low rated voltage characteristic can be improved between the gate region 107 and the substrate 101. The rated voltage of the gate region 107 is determined depending upon the rated voltage between the lightly doped gate region 163 and the P type substrate 101. This rated voltage can easily attain a high rated voltage of 100 V or above.

Figure 17:
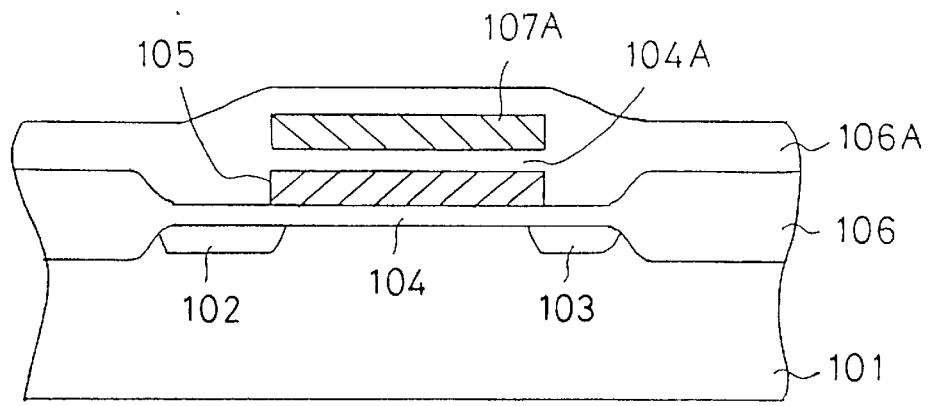
FIG. 17 is a cross-sectional view of a semiconductor device in accordance with another embodiment of the present invention.

FIG. 17 is a cross-sectional view of a semiconductor device in accordance with a still further embodiment of the present invention, which has the gate region overlying the gate electrode with an insulative film being sandwiched therebetween. More specifically an N+ type source region 102 and a drain region 103 are provided which are spaced apart from each other in the surface of the P type silicon substrate 101. An intermediate gate electrode 105 is provided above the channel formation region at a surface portion of the substrate 101 defined between the source region 102 and drain region 103 while a first gate insulation film 104 is laid between the substrate and the intermediate gate electrode 105. Furthermore, a gate region (electrode) 107A is provided above the intermediate gate electrode 105 with a second gate insulation film 104A being sandwiched therebetween. The gate region 107A is capacitively coupled to the intermediate gate electrode by a capacitance as defined by the second gate insulation film 104A. Accordingly, the channel impedance between the source region 102 and drain region 103 can be changed by controlling the potential at the intermediate gate electrode upon application of a voltage to the gate region 107A. In other words, it can operate as an ordinary field effect transistor. The cross-section of the semiconductor device of FIG. 17 may be similar in structure to a well known floating gate nonvolatile memory; however, the former differs significantly from the latter in that the intermediate gate electrode 105 is connected to the voltage set means (not shown in FIG. 17). The semiconductor device of the present invention is difficult in operating as a nonvolatile memory; it may preferably be used as a typical driver transistor, a transistor for use in logic circuits, or a transistor for analog circuits. in the case where the gate region 107A is placed above the intermediate gate electrode 105 as shown in FIG. 17, any parasitic capacitance of the gate region 107A can be rendered smaller than that in the embodiment of FIG. 7. When the gate region is formed on the surface of the substrate 101, it will no longer be suitable for use in high-speed devices due to the presence of a junction capacitance as defined between the gate region and the substrate. In addition, the embodiment of FIG. 17 is suitable for achievement of higher integration because the intermediate gate electrode 105 can be decreased in area. Moreover, the electrical characteristics thereof remain controllable with enhanced accuracy due to the fact that any parasitic capacitance of the intermediate gate electrode 105 can also be decreased.

Figure 18:
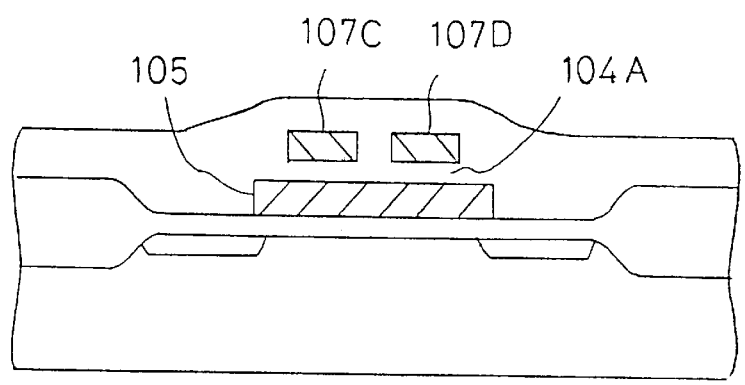
FIG. 18 is a cross-sectional view of a semiconductor device in accordance with another embodiment of the present invention.

FIG. 18 is a cross-sectional view of a semiconductor device in accordance with a yet further embodiment of the present invention employing a plurality of gate regions. Two gate regions of gate regions 107C, 107D are provided above the intermediate gate electrode 105. Such gate regions are provided in parallel with each other such that each of them is capacitively coupled to the intermediate gate electrode 105. Therefore, the potential at the intermediate gate electrode 105 is controlled by both gate regions of respective gate regions 107C, 107D. Changing the potential at one gate region enables the electrical characteristic (variation in channel impedance relative to the gate voltage) to vary with respect to the other gate region. More specifically, the value of an application voltage at one gate region can be utilized to change the threshold voltage of transistor with respect to the other gate region. In other words, it is possible to adjust the transistor's threshold voltage by use of a plurality of gate regions (including adjustment at a fixed value, and providing a transistor with a plurality of kinds of threshold voltages). As a consequence, the resulting device structure is suitable for use in analog circuits being required to have a high-accuracy threshold voltage(s), or transistors of analog circuits having a plurality of kinds of threshold voltages.

Figure 19:
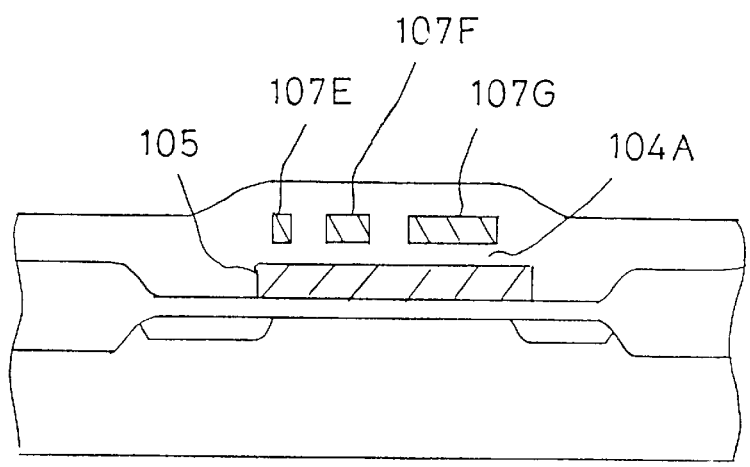
FIG. 19 is a cross-sectional view of a semiconductor device in accordance with another embodiment of the present invention.

FIG. 19 is a cross-sectional view of a semiconductor device in accordance with a further embodiment of the present invention, which renders the electrical characteristics such as threshold voltages adjustable with enhanced accuracy for wide range. While not shown in the drawing, the voltage set means is also provided therein and connected to the intermediate gate electrode 105.

As shown in FIG. 19, parallel gate regions 107E, 107F and 107G which differ in area from one another are provided above the intermediate gate electrode 105. The capacitance between a respective one of such gate regions and the intermediate gate electrode 105 is determined in such a way that they are exponentially weighted providing a ratio of 1:2:4, for example. With such a plurality of gate regions exponentially weighted in capacitance value, it becomes possible to accurately adjust the electrical characteristics with respect to a specific gate region throughout a wide range thereof.

Figure 20:
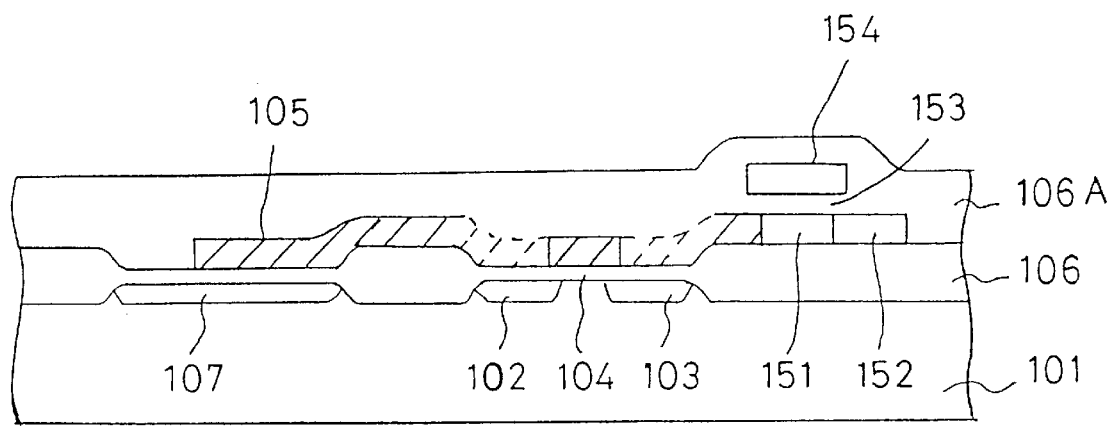
FIG. 20 is a cross-sectional view of a semiconductor device in accordance with another embodiment of the present invention.

FIG. 20 is a cross-sectional view of semiconductor device also embodying the present invention, which employs a thin-film transistor for the voltage set means. The intermediate gate electrode 105 is comprised of a polycrystalline silicon film in order to form it with the same thin film as in the thin film transistor. The intermediate gate electrode 105 is extended to ride on the field insulation film 106. The intermediate gate electrode 105 is doped to have N+ type conductivity. A channel formation region 151 and an N+ type drain region 152 are provided in the same thin film as that of the intermediate gate electrode 10S. A gate electrode 154 of the thin-film transistor is provided over the channel formation region 151 with a gate insulation film 153 being sandwiched therebetween. The channel formation region 151 is formed in the lightly doped impurity region enabling it to invert in polarity upon application of a voltage to the gate electrode 154. In the embodiment of FIG. 20 the gate insulation film 153 and gate electrode 154 of the thin-film transistor are provided over the channel formation region 151; these may alternatively be arranged beneath it. As shown in FIG. 20, connecting the intermediate gate electrode 105 as the source region of the thin-film transistor may enable the potential at intermediate gate electrode 105 to be set by voltages being applied to the gate electrode 154 and drain region 152. Typically, after causing the intermediate gate electrode 105 to be set at 0 V by application of a 0-V voltage to the drain region 152, a voltage is then given to the gate region 107 controlling the channel impedance between the source region 102 and drain region 103.

Figure 21:
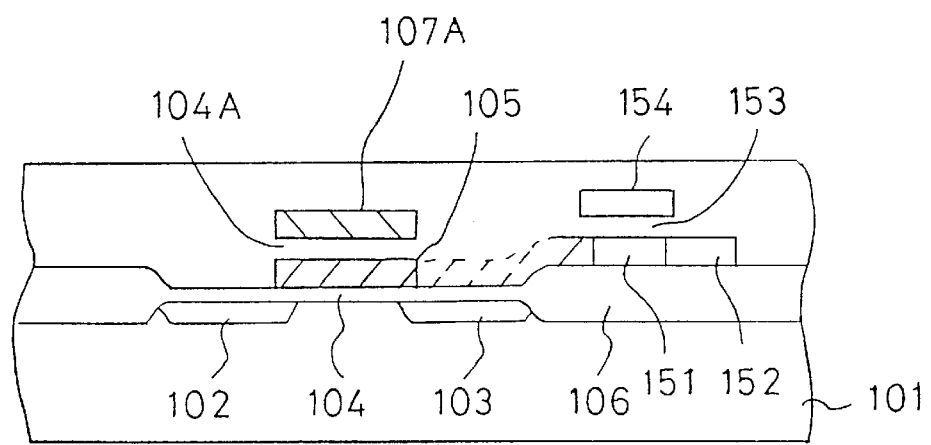
FIG. 21 is a cross-sectional view of a semiconductor device in accordance with another embodiment of the present invention.

FIG. 21 is a cross-sectional view of a semiconductor device further embodying the present invention, which causes the gate region to be located above the intermediate gate electrode 105 with the second gate insulation film 104A being sandwiched between the gate region and the intermediate gate electrode 105. The voltage set means consisting of a thin-film transistor is provided by extending a thin film as used to form the intermediate gate electrode 105. Using such thin-film transistor as the voltage set means enables any parasitic capacitances to decrease between the intermediate gate electrode 105 and the voltage set means; as a result, the intermediate gate electrode 105 can be well controlled in potential by the voltage of the gate region 107.

The semiconductor device and the manufacturing method thereof exhibit the following effects:
(1) The manufacture is simple.
(2) The manufacture is short in term.
(3) The manufacturing cost is low.
(4) Making the gate insulation film thinner
(5) Reduction in the manufacturing cost and improvement in the manufacture TAT due to the common use of a gate insulation film for high rated voltage MISFETs and for low rated voltage MISFETs.

What is claimed is:

1. A manufacturing method of a semiconductor device having a semiconductor substrate with its surface being provided with a plurality of first conductivity type low rated voltage MISFETs, a plurality of second conductivity type low rated voltage MISFETs, a first conductivity type high rated voltage MISFET, and a second conductivity type high rated voltage MISFET, said method comprising the steps of forming a well of the second conductivity type in a surface of said substrate corresponding to drain regions of said first conductivity type low rated voltage MISFET and said second conductivity type high rated voltage MISFET, forming an oxidation-proof film on the surface of said substrate, removing portions of the oxidation-proof film in regions corresponding to a region for electrical separation of each of said MISFETs and drain regions of said first conductivity type and second conductivity type high rated voltage MISFETs, doping an impurity element of the first conductivity type into the surface of said substrate corresponding to the isolation region between said low rated voltage MISFETs of the second conductivity type and the drain region of said high rated voltage MISFET of the first conductivity type, forming a field oxide film by selective oxidation of the surface of said substrate with said oxidation-proof film being as a mask, removing said oxidation-proof film, forming a gate insulation film on the surface of said substrate with none of said field oxide film, patterning a gate electrode of each of said MISFETs on said gate insulation film, forming source and drain regions of said low rated voltage MISFET of the first conductivity type, and forming source and drain regions of said low rated voltage MISFET of the second conductivity type.

2. A semiconductor device comprising source and drain regions of a second conductivity type spaced apart from each other in a surface of a semiconductor substrate of a first conductivity type, a channel formation region being a surface of said semiconductor substrate between said source region and said drain region, a gate region formed in the surface of said semiconductor substrate spaced apart from said source and drain regions, and an intermediate gate electrode above said channel formation region with a gate insulation film being sandwiched therebetween, wherein a threshold voltage of said gate region for inverting said channel formation region is at a constant value, and wherein a capacitance CG between said gate region and said intermediate gate electrode and a total capacitance CT around said intermediate gate electrode satisfies a relation defined by CG/CT<0.55.

3. A semiconductor device as claimed in claim 2, wherein said intermediate gate electrode is connected to voltage set means.

4. A semiconductor device as claimed in claim 2, wherein said channel formation region includes a plurality of threshold-value controlling impurity regions provided therein.

5. A semiconductor device as claimed in claim 2, wherein said channel formation region includes a plurality of threshold-value controlling impurity regions provided therein, and that said threshold-value controlling impurity regions measure 2 μm or below in length along either the direction of channel width or the direction of channel length thereof.

6. A semiconductor device as claimed in claim 2, wherein said drain region comprises a first drain region consisting of a heavily doped region of the second conductivity type, and a second drain region consisting of a lightly doped region of the second conductivity type between said first drain region and said channel formation region.

7. A semiconductor device as claimed in claim 2, wherein an insulative film between said drain region and said intermediate gate electrode is so formed as to be thicker than said gate insulation film.

8. A semiconductor device comprising source and drain regions of a second conductivity type spaced apart from each other in a surface of a semiconductor substrate of a first conductivity type, a channel formation region being a surface of said semiconductor substrate between said source region and said drain region, a gate region formed in the surface of said semiconductor substrate spaced apart from said source and drain regions, and an intermediate gate electrode above said channel formation region with a gate insulation film being sandwiched therebetween, wherein a threshold voltage of said gate region for inverting said channel formation region is at a constant value, and wherein a capacitance CD between said drain region and said intermediate gate electrode is less in value than a capacitance CS between said source region and said intermediate gate electorde.

9. A semiconductor device comprising source and drain regions of a second conductivity type spaced apart from each other in a surface of a semiconductor substrate of a first conductivity type, a channel formation region being a surface of said semiconductor substrate between said source region and said drain region, a gate region formed in the surface of said semiconductor substrate spaced apart from said source and drain regions, and an intermediate gate electrode above said channel formation region with a gate insulation film being sandwiched therebetween, wherein a threshold voltage of said gate region for inverting said channel formation region is at a constant value, and wherein a high rated voltage gate region consisting of a lightly doped region being the same in conductivity type as said gate region is provided to surround said gate region.

10. A semiconductor device comprising spaced-apart source and drain regions of a second conductivity type provided in a surface of a semiconductor region of a first conductivity type, a channel formation region being part of the surface of said semiconductor region between said source region and said drain region, a first gate insulation film formed on the surface of said channel formation region, an intermediate gate electrode provided above said channel formation region with said first gate insulation film being sandwiched therebetween, a gate region capacitively coupled to said intermediate gate electrode through a second gate insulation film, and a voltage reset circuit connected to the intermediate gate electrode for supplying carriers thereto.

11. A semiconductor device as claimed in claim 10, characterized in that said gate region is provided above said intermediate gate electrode.

12. A semiconductor device as claimed in claim 10, wherein said gate regions is provided as a plurality of members.

13. A semiconductor device as claimed in claim 10, wherein said voltage reset circuit comprises a thin-film transistor.

14. The semiconductor device of claim 10, wherein the gate region comprises a plurality of members insulated from each other and capacitively coupled in parallel to the intermediate gate electrode, and wherein capacitance values between the members of the gate region and the intermediate gate electrode are different from each other.

15. A semiconductor device comprising source and drain regions of a second conductivity type spaced apart from each other in a surface of a semiconductor region of a first conductivity type, a channel formation region being part of the surface of said semiconductor region between said source region and said drain region, a first gate insulation film formed on the surface of said channel formation region, an intermediate gate electrode provided above said channel formation region with said first gate insulation film being sandwiched therebetween, a gate region capacitively coupled to said intermediate gate electrode through a second gate insulation film, and a thin-film transistor provided on the semiconductor region and connected to the intermediate gate electrode for supplying carriers thereto.

16. A semiconductor device comprising:
   a substrate of a first conductivity type defining a surface;
   a first and a second diffusion region of a second conductivity type formed in the surface of the substrate;
   a low-voltage inverter circuit comprising a low rated voltage first conductivity type MISFET formed in a surface of the first diffusion region and a low rated voltage second conductivity type MISFET formed in the surface of the substrate, the low rated voltage second conductivity type MISFET having an isolation region associated therewith, the low rated voltage first conductivity type MISFET and the low rated voltage second conductivity type MISFET being connected in series between a first power supply voltage and a ground voltage;

a high-voltage inverter circuit comprising a high rated voltage first conductivity type MISFET formed in the second diffusion region and a high rated voltage second conductivity type MISFET formed in the surface of the substrate, the high rated voltage first conductivity type MISFET having a lightly doped drain region and a heavily doped drain region and the high rated voltage second conductivity type MISFET having a lightly doped drain region and a heavily doped drain region, the high rated voltage first conductivity type MISFET and the high rated voltage second conductivity type MISFET being connected in series between the second power supply voltage and the ground voltage;

wherein the lightly doped drain region of the high rated voltage first conductivity type MISFET has the same impurity type and concentration as the isolation region of the low rated voltage second conductivity type MISFET, and wherein the lightly doped drain region of the high rated voltage second conductivity type MISFET has the same impurity type and concentration as the first diffusion region.

17. A semiconductor device comprising:

spaced-apart source and drain regions of a second conductivity type provided in a surface of a semiconductor region of a first conductivity type;

a channel formation region being part of the surface of said semiconductor region between said source region and said drain region;

a first gate insulation film formed on the surface of said channel formation region;

an intermediate gate electrode provided above said channel formation region with said first gate insulation film being sandwiched therebetween; and a gate region capacitively coupled to and formed on said intermediate gate electrode through a second gate insulation film;

wherein a threshold voltage of said gate region for inverting said channel formation region is at a constant value and a capacitance CG between said gate region and said intermediate gate electrode and a total capacitance CT around said intermediate gate electrode satisfies a relation defined by CG/CT<0.55.

* * * * *